United States Patent [19]

Ha

[11] Patent Number: 5,990,020
[45] Date of Patent: Nov. 23, 1999

[54] METHOD FOR FORMING A CONDUCTIVE PLUG

[75] Inventor: Jae-Hee Ha, Chungcheongbuk-do, Rep. of Korea

[73] Assignee: LG Semicon Co., Ltd., Chungcheongbuk-Do, Rep. of Korea

[21] Appl. No.: 08/997,978

[22] Filed: Dec. 24, 1997

[30] Foreign Application Priority Data

Dec. 26, 1996 [KR] Rep. of Korea ................. 96/72200

[51] Int. Cl.$^6$ ................................................. H01L 21/00
[52] U.S. Cl. ..................... 438/738; 438/672; 438/734; 438/742
[58] Field of Search ................................. 438/637, 672, 438/720, 723, 734, 742, 743, 737, 738; 216/67, 75

[56] References Cited

U.S. PATENT DOCUMENTS 5,827,436 10/1998 Kamide et al. ................. 438/720 X

OTHER PUBLICATIONS

IEEE Transactions of Semiconductor Manufacturing, vol., 3, No. 3, Aug. 1990, Development of a Magnetron–Enhanced Plasma Process for Tungsten Etchback with Response–Surfaxe Methodology, Paul E. Riley, et al, pp. 142–144.

Mechanism of Plug Loss Suppression in Tungsten Etchback processes by a Redeposition of Titanium reaction Products, Satoru Mihara et al, Process Development Div., Fujitsu Limited, ECS Proceedings 10th Symp. Plasma Proc., vol. PV 94.20, pp. 449–459.

*Primary Examiner*—William Powell

[57] ABSTRACT

A method for forming a semiconductor device contact plug in a contact hole without a plug cavity. The method forms a contact hole on a substrate, and then forms a barrier layer in the contact hole. Next, a contact plug is formed on the barrier layer in the contact hole. After the formation of the contact plug, a portion of the barrier layer is selectively removed using a gas mixture of a first gas and a second gas. The first gas etches the barrier layer, and the second gas forms a protective layer to prevent a cavity from forming.

23 Claims, 4 Drawing Sheets

METHOD FOR FORMING A CONDUCTIVE PLUG

BACKGROUND OF THE INVENTION

1. Field of the Invention

The present invention relates to a method for forming a plug and more particularly, to a method for forming a conductive plug in a contact hole without a cavity formed therein.

2. Discussion of the Related Art

When a high integrated device is manufactured, due to low step coverage of a metal layer such as titanium(Ti), titanium nitride (TiN), titanium tungsten (TiW), or aluminum, the process of metal wiring is facilitated after the deposition of a tungsten layer. That is, the tungsten layer is deposited in a metal contact hole or a via and etched-back to form a tungsten plug. However, since tungsten is grown on an oxide layer at a low speed, a glue layer made of Ti, TiN, or TiW is required prior to forming the tungsten layer to ensure the formation of the tungsten layer. In this case, the above process can proceed without removing the glue layer after the tungsten layer is etched-back. On the other hand, the above process may proceed after removing the glue layer in order to minimize loss of the tungsten plug for a stacked structure having more than 4 wires, such as a logic device.

A conventional method for forming a conductive plug in a contact hole will be discussed with reference to the attached drawings.

As shown in FIG. 1a, on the entire surface of a substrate 1, there is formed an interlayer insulating layer 2 using a chemical vapor deposition (CVD) process or a thermal oxidation process. A photoresist layer is coated on the surface of the interlayer insulating layer 2 and then exposed and developed to form a patterned photoresist layer. With the patterned photoresist layer serving as a mask, the interlayer insulating layer 2 is anisotropically etched to form a contact hole 5 on a predetermined portion of the substrate 1. Subsequently, on the resultant surface, there is formed a glue layer 3, which is a barrier layer, made of titanium (Ti), titanium nitride (TiN), or titanium tungsten (TiW) on the interlayer insulating layer 2 and in the contact hole 5. Thereafter, a tungsten layer 4 is formed over the substrate 1 using a CVD process.

Referring to FIG. 1b, the tungsten layer 4 is etched-back using fluorine gas that is injected into a plasma reactor, thereby the fluorine gas etches the tungsten layer 4 to form a tungsten plug 4a in the contact hole 5.

Referring to FIG. 1c, the glue layer 3 is etched using chlorine ($Cl_2$) gas, argon (Ar) gas, helium (He) gas, or oxygen ($O_2$) gas in the plasma reactor. In this case, due to the chemical etching properties between chlorine gas and the glue layer 3, the glue layer 3 on the interlayer insulating layer 2 is etched away as well as a portion of the glue layer 3 in contact with a side of the interlayer insulating layer 2 in the contact hole. As a result, a serious plug cavity 6 is formed.

A conventional method for forming a conductive plug in a contact hole has the following problems.

First, a portion of the glue layer that is in contact with an interlayer insulating layer is over-etched, which forms a plug cavity.

Second, due to the plug cavity, a void is generated in a metal wiring process that decreases the reliability of a unit device.

SUMMARY OF THE INVENTION

Therefore, the present invention is directed to a method for forming a conductive plug in a contact hole of a semiconductor device that substantially obviates one or more of problems due to limitations and disadvantages of the related art.

An object of the invention is to provide a method for forming a conductive plug for a semiconductor device in a contact hole by preventing a plug cavity that achieves good reliability.

Still another object of the present invention is to provide a method of forming a conductive plug in a contact hole using a first gas to etch a glue layer, i.e., barrier layer, and a second gas to control the rate of etching by the first gas.

To achieve these and other advantages and in accordance with the purpose of the present invention, as embodied and broadly described, there is provided a method for forming a conductive plug in a contact hole that includes the steps of: providing a substrate; forming a contact hole on the substrate; forming a barrier layer in the contact hole; forming a contact plug on the barrier layer and in the contact hole; and selectively removing a portion of the barrier layer using a gas mixture of a first gas and a second gas, the first gas removes a portion of the barrier layer and the second gas forms a protective layer on at least the surface of the barrier layer adjacent to the contact plug.

In another aspect of the present invention, there is provided a method for forming a conductive plug in a contact hole that includes the steps of: providing a substrate; forming a contact hole on the substrate; forming a barrier layer in the contact hole; forming a contact plug on the barrier layer and in the contact hole; and selectively removing the barrier layer using a mixture of a first gas and a second gas, the first gas removes a portion of the barrier layer and the second gas controls the rate of removal by the first gas.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and, thus, are not limitative of the present invention, and wherein.

DETAILED DESCRIPTION OF THE PREFERRED EMBODIMENTS

Reference will now be made in detail to the preferred embodiment of the present invention, examples of which are illustrated in the accompanying drawings.

Figure 2A:
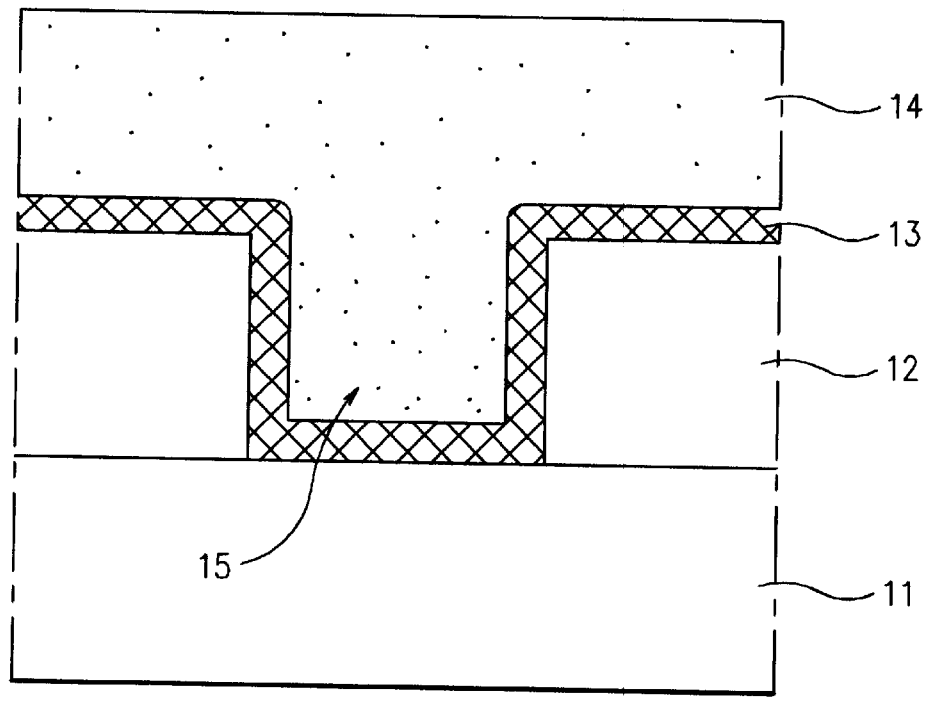
FIGS. 2a to 2c are cross-sectional views showing a method for forming a conductive plug in a contact hole according to a preferred embodiment of the present invention.

Referring initially to FIG. 2a, an interlayer insulating layer 12 is formed on a substrate 11 using a chemical vapor deposition (CVD) process or a thermal oxidation process. Next, a photoresist layer is formed on the entire surface and then exposed and developed to form a patterned photoresist layer. With the patterned photoresist layer serving as a mask, the interlayer insulating layer 12 is anisotropically etched to form a contact hole 15 on a predetermined portion of the substrate 11. Subsequently, on the resultant surface, a glue layer 13, which is also a barrier layer, is formed on the interlayer insulating layer 12 and in the contact hole 15. The glue layer 13 is, preferably, made of Ti, TiN, or TiW. Thereafter, a tungsten layer 14 is formed on the resultant surface using a CVD process.

Figure 2B:
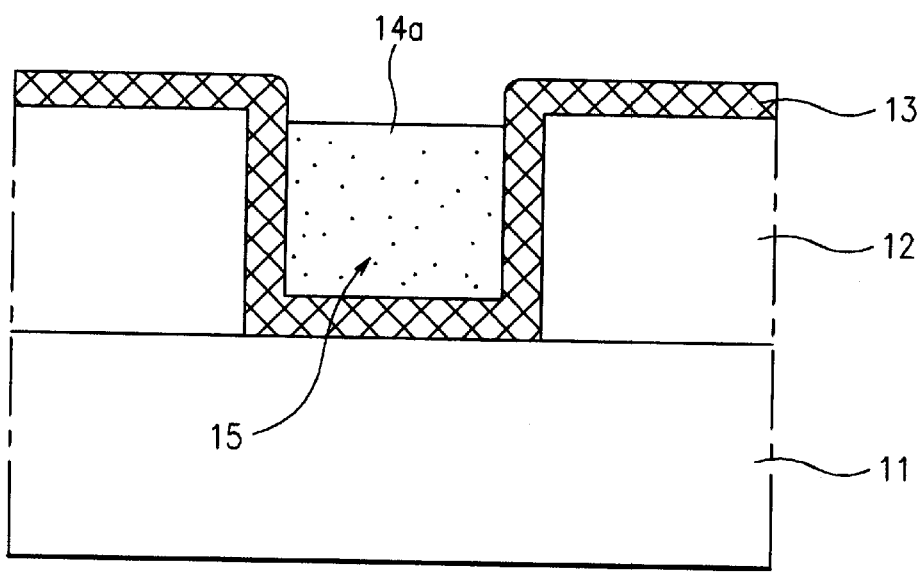

Referring to FIG. 2b, using fluorine gas in a plasma reactor, the tungsten layer 14 is etched-back to form a tungsten plug 14a in the contact hole 15.

Figure 2C:
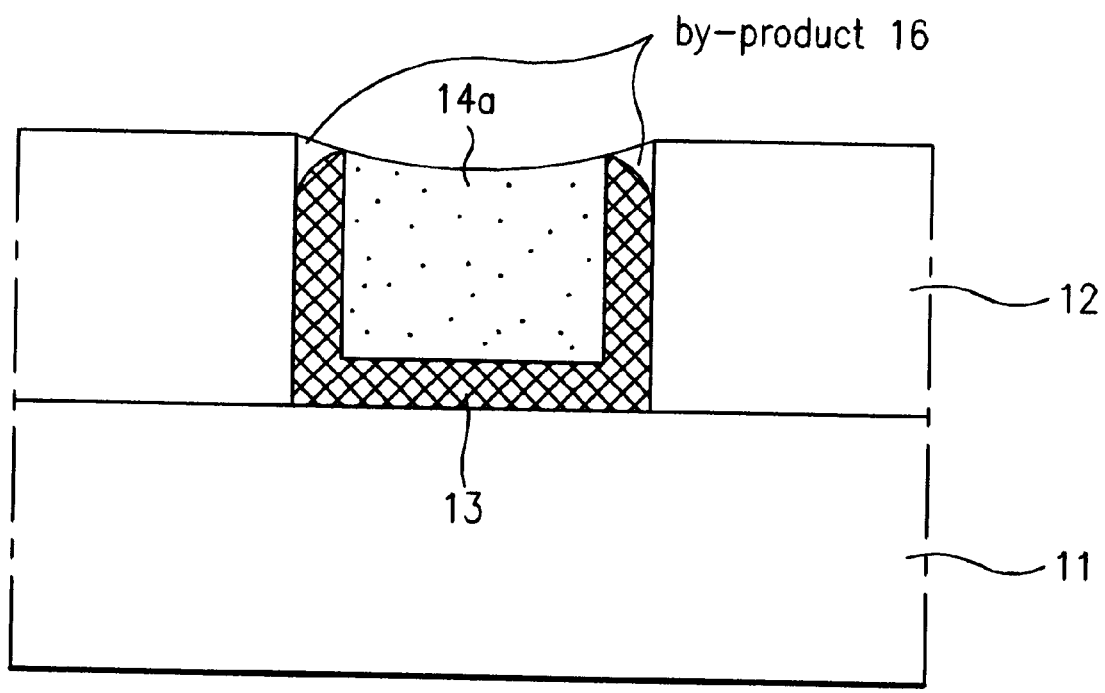

Referring to FIG. 2c, after the tungsten layer 14 is etched-back, the glue layer 13 is etched using a gas mixture of a first gas with a second gas, so that only the portion of the glue layer 13 surrounding the tungsten plug 14a remains. Preferably, the gas mixture is $Cl_2/BCl_3$. The $Cl_2$ gas is used to etch the glue layer 13. The $BCl_3$ gas dissociates into Cl ions and $BCl_x$ ions. The Cl ions etch the glue layer 13, while $BCl_x$ ions serve to form a by-product 16 that prevents the glue layer between the conductive plug and interlayer insulating layer from being over-etched. The mixture of gas $Cl_2/BCl_3$ is used in a Helicon type high density plasma reactor to etch-back the glue layer 13.

The gas mixture $Cl_2/BCl_3$ etches both the glue layer 13 and the tungsten plug 14a. When $Cl_2$ alone is used, as in the conventional art FIG. 1c, the etch rate of the tungsten is about 500–600 Angstroms per min. However, when the gas mixture $Cl_2/BCl_3$ is used, the etch rate is about 60 Angstroms per minute, i.e., an order of magnitude less!

Figure 1A:
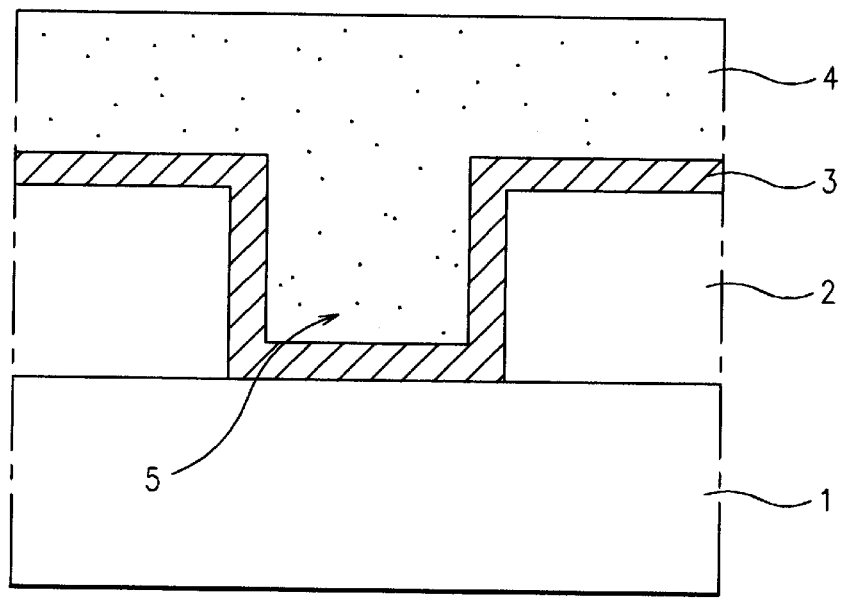
FIGS. 1a to 1c are cross-sectional views showing a conventional method for forming a conductive plug in a contact hole.
Figure 1B:
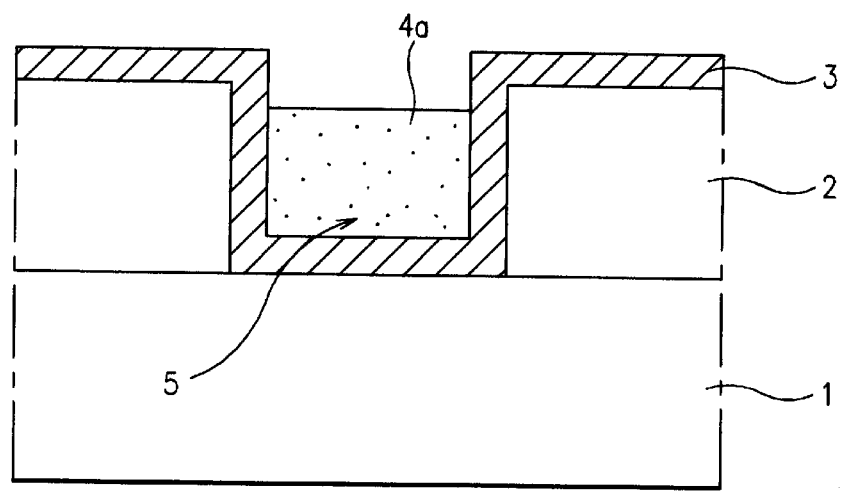
Figure 1C:
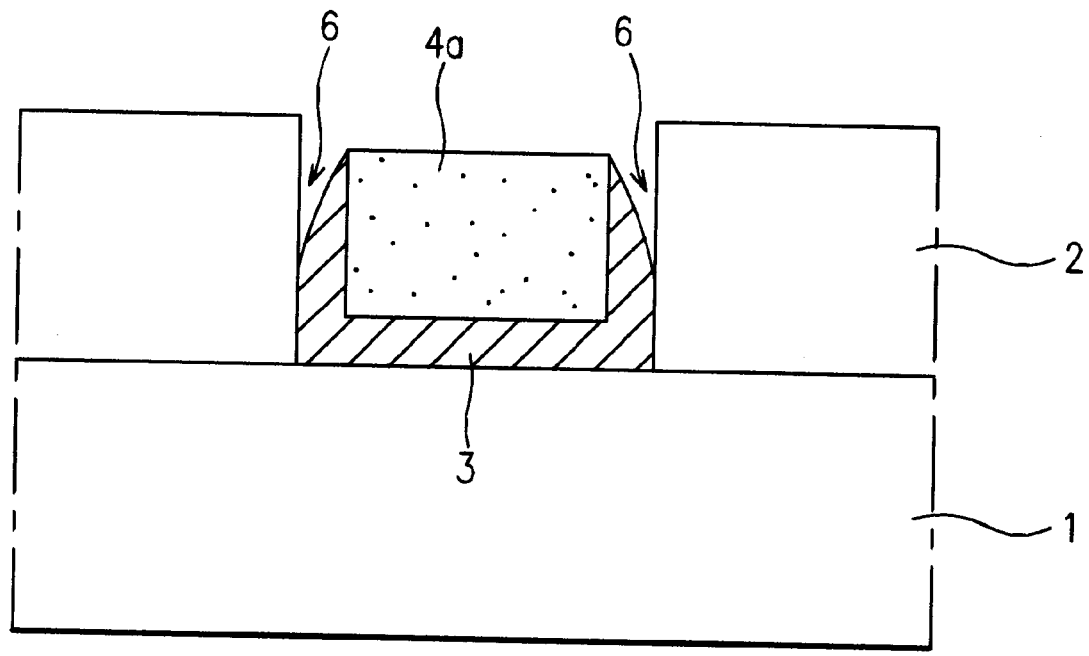

When the gas mixture $Cl_2/BCl_3$ etches the glue layer 13, a by-product polymer 16 is formed via the $BCl_x$ ions at the interface of the glue layer 13 and the interlayer insulating layer 12, thereby filling in the cavities 6 of conventional art FIG. 1c. Thus, despite the glue layer 13 being etched at a higher rate by the gas mixture $Cl_2/BCl_3$ than the tungsten plug 14a, exposed surfaces of the glue layer 13 and the tungsten plug 14a together form a cup shape. Again, this is because accumulation of the byproduct 16 prevents the cavities 6 of the conventional art FIG. 1c from remaining.

A source power of 1000–1500W is used for the above reactor and a flow rate of the gas mixture of $Cl_2/BCl_3$ is between 3:1 and 4:1, respectively. Adjusting the flow rate between the $BCl_3$ gas with the $Cl_2$ gas, controls the etching rate of the $Cl_2$ gas. That is, the proportion of the BCl3 gas that reacts to form a by-product controls the effective rate at which the $Cl_2$ gas etches the glue layer. A bias power of 60–100W is used and a temperature range of –10° C.–0°C. is used to adjust the temperature of the substrate when the glue layer 13 is etched. When the glue layer 13 is etched under the aforementioned conditions, a by-product is produced beside the interlayer insulating layer 12 in the contact hole, so as to form the tungsten plug 14a without a cavity between the tungsten plug 14a and the interlayer insulating layer 12. Thus, a stable wiring can be formed without forming a void by the following process and the tungsten plug 14a can be reduced to 50 Angstroms or less while etching the glue layer 13.

The method for forming a conductive plug in a contact hole according to the present invention has following advantages.

First, since a gas mixture of $Cl_2/BCl_3$ in a high density plasma reactor is used to etch a glue layer after the etch-back of a tungsten layer, a by-product is produced to prevent the generation of a plug cavity; thereby producing a device having good reliability and good wiring.

Second, when the glue layer is etched using a flow rate of the gas mixture of $Cl_2/BCl_3$ and using a low bias power, a loss of the tungsten layer can be adjusted for the tungsten contact plug.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a semiconductor device contact plug, the method comprising the steps of:

providing a substrate;

forming a contact hole on the substrate;

forming a barrier layer in the contact hole;

forming a contact plug on the barrier layer and in the contact hole; and selectively removing a portion of the barrier layer using a gas mixture of a first gas and a second gas, the first gas being used to remove a portion of the barrier layer and the second gas being used to form a protective layer on at least the surface of the barrier layer adjacent to the contact plug.

2. The method of claim 1, wherein the step of forming a contact hole includes the steps of:

forming an interlayer insulator layer on the substrate; and selectively removing a portion of the interlayer insulator layer to form the contact hole.

3. The method of claim 1, wherein the barrier layer is a glue layer.

4. The method of claim 3, wherein the glue layer is at least one of a titanium (Ti), titanium nitride (TiN), and titanium tungsten (TiW) layer.

5. The method of claim 1, wherein the step of forming a contact plug includes the steps of:

forming a conductive layer on the barrier layer in the contact hole; and selectively removing a portion of the conductive layer with a third gas to form the contact plug.

6. The method of claim 5, wherein the conductive layer is a tungsten (W) layer.

7. The method of claim 5, wherein the third gas is a fluorine gas.

8. The method of claim 1, wherein the first gas and the second gas are a $Cl_2$ gas and a $BCl_3$ gas, respectively.

9. The method of claim 8, wherein the protective layer is a by-product of the $BCl_3$ gas with the barrier layer that prevents the barrier layer from being over-etched by the $Cl_2$ gas.

10. The method of claim 8, wherein the step of selectively removing includes the step of:

etching the barrier layer using the $Cl_2$ gas.

11. The method of claim 10, wherein the step of etching the barrier layer uses a power source of 1000–1500W.

12. The method of claim 10, wherein the step of etching the barrier layer uses a bias power between 60W and 100W.

13. The method of claim 10, wherein a temperature of the substrate is between –10° C. and 0° C.

14. The method of claim 8, wherein a flow rate of the gas mixture of $Cl_2$ gas with the $BCl_3$ gas is between 3:1 and 4:1, respectively.

15. The method of claim 8, wherein the $BCl_3$ gas disassociates into Cl ions and $BCl_x$ ions the $BCl_x$ ions forms the by-product.

16. A method of forming a semiconductor device contact plug, comprising the steps of:

providing a substrate;

forming a contact hole on the substrate;

forming a barrier layer in the contact hole;

forming a contact plug on the barrier layer and in the contact hole; and selectively removing a portion of the barrier layer using a mixture of a first gas and a second gas, the first gas being used to remove a portion of the barrier layer and the second gas being used to control the rate of removal by the first gas.

17. The method of claim 16, wherein the step of forming a contact hole includes the steps of:

forming an interlayer insulator layer on the substrate; and selectively removing a portion of the interlayer insulator layer to form the contact hole.

18. The method of claim 16, wherein the barrier layer is a glue layer, the glue layer being a tungsten layer.

19. The method of claim 16, wherein the first gas and the second are a $Cl_2$ gas and a $BCl_3$ gas, respectively.

20. The method of claim 19, wherein the step of selectively removing includes the steps of:

etching the barrier layer using the $Cl_2$ gas; and forming a by-product using the $BCl_3$ gas to prevent the $Cl_2$ gas from over-etching the barrier layer.

21. The method of claim 20, wherein a flow rate of the $Cl_2$ gas with the $BCl_3$ gas is between 3:1 and 4:1, respectively, to etch the barrier layer.

22. The method of claim 21, wherein the ratio of the $BCl_3$ gas with the $Cl_2$ gas controls the rate at which the $Cl_2$ etches the barrier layer.

23. The method of claim 19, wherein the $BCl_3$ gas disassociates into Cl ions and $BCl_x$ ions, the $BCl_x$ ions forms the by-product.

* * * * *